(12) United States Patent
Moore

(10) Patent No.: US 7,064,554 B2
(45) Date of Patent: Jun. 20, 2006

(54) FLUORESCENT LIGHT BULB TEST APPARATUS AND METHOD OF USE

(76) Inventor: Harold Moore, 3020 SE. 22nd Cir., Del City, OK (US) 73102

( * ) Notice: Subject to any disclaimer, the term of this patent is extended or adjusted under 35 U.S.C. 154(b) by 0 days.

(21) Appl. No.: 10/960,236

(22) Filed: Oct. 7, 2004

(65) Prior Publication Data

US 2006/0076962 A1     Apr. 13, 2006

(51) Int. Cl.
 *G01R 31/02*     (2006.01)
(52) U.S. Cl. .................................. 324/555; 324/556
(58) Field of Classification Search ................ 324/555, 324/556, 414, 73.1
 See application file for complete search history.

(56) References Cited

U.S. PATENT DOCUMENTS

| | | | |
|---|---|---|---|
| D211,088 S | 5/1968 | Schwartz et al. | |
| D236,594 S | 9/1975 | Smith | |
| D251,183 S | 2/1979 | Howard | |
| 4,176,315 A * | 11/1979 | Sunnarborg | 324/156 |
| 4,617,519 A * | 10/1986 | Rosenthal | 324/414 |
| 2002/0021132 A1* | 2/2002 | Halden | 324/556 |

* cited by examiner

*Primary Examiner*—Vincent Q. Nguyen
(74) *Attorney, Agent, or Firm*—Raymond M. Galasso; Galasso & Associates, L.P.

(57) ABSTRACT

An apparatus for testing a fluorescent light bulb is disclosed. The apparatus includes a circular housing including a pair of contact receptacles operable to receive two conductive elements of a fluorescent light bulb. A lamp housing is coupled to a portion of an outside surface of the housing and extending away from the housing and sized to receive a low-voltage lamp. A power source is coupled between the contact receptacles and the low-voltage lamp and operable to illuminate the low-voltage lamp when an electrode of the fluorescent light bulb is coupled to the contact receptacles.

16 Claims, 4 Drawing Sheets

FLUORESCENT LIGHT BULB TEST APPARATUS AND METHOD OF USE

FIELD OF THE DISCLOSURE

The invention relates generally to portable electrical testers, and more particularly to a fluorescent light bulb test apparatus and method of use.

BACKGROUND

The central element in a fluorescent lamp is a sealed glass tube. The tube contains a small bit of mercury and an inert gas, typically argon, kept under very low pressure. The tube also contains a phosphor powder, coated along the inside of the glass. The tube has two electrodes, one at each end, which are wired to an alternating current (AC) supply.

When you turn the lamp on, current flows through the electrical circuit to the electrodes within each end of the fluorescent tube. Considerable voltage is developed across the electrodes and electrons migrate through the gas from one end of the tube to the other. This energy changes some of the mercury in the tube from a liquid to a gas. As electrons and charged atoms move through the tube, some of them will collide with the gaseous mercury atoms and these collisions excite the atoms, bumping electrons up to higher energy levels. When the electrons return to their original energy level, they release light photons creating light.

Phosphor coatings are provided within fluorescent tubes to give off light when they are exposed to light. In a fluorescent lamp, the emitted light is in the visible spectrum—the phosphor gives off white light we can see and manufacturers can vary the color of the light by using different combinations of phosphors.

The testing of fluorescent lamps is typically done through randomly replacing lights within ceiling mounts. This can lead to over sampling light tubes to determine an operating state of each light bulb which may take a considerable amount of time. As such, what is needed is a method and apparatus for testing a fluorescent tube without mounting a fluorescent tube within a light fixture to determine its operational status.

BRIEF DESCRIPTION OF THE DRAWINGS

Other advantages, features and characteristics of the invention, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DETAILED DESCRIPTION OF THE FIGURES

An apparatus for testing fluorescent light bulbs is provided. In one form, a fluorescent light bulb tester includes a circular housing having a pair of contact receptacles operable to receive two conductive elements of a fluorescent light bulb. The tester further includes a lamp housing extending from a portion of an outside surface of the circular housing with the lamp housing providing a contact for connecting a low-voltage lamp. A power source such as two direct current batteries are electrically coupled between the contact receptacles and the low-voltage lamp and operable to light the low-voltage lamp when an operational electrode of the fluorescent light bulb is electrically coupled between the contact receptacles. In the manner, a user may determine the operation status of fluorescent light bulb without having to mount the fluorescent light bulb within a light fixture.

In a particularized form, an apparatus for testing fluorescent light bulbs includes a housing having a base, a sidewall, and an access panel coupled to a top portion of the housing to provide access to an interior of the housing. The interior includes a portion of the base having a first battery holder coupled to the base and operable to hold a first direct current battery and a second battery holder coupled to the base and operable to hold a second direct current battery. A first contact receptacle is coupled to the first battery holder using a brass interconnect and a second contact receptacle coupled to the second battery holder using a second brass interconnect. The sidewall of the housing includes a lamp housing extending through the sidewall from the interior of the housing to an exterior of the housing wherein the lamp housing is operable to house a low-voltage lamp. A first conductor is directly connected between a first lamp conductor and the first battery holder and a second conductor is directly connected between a second lamp conductor and the second battery holder. Each battery provides power to the lamp if a valid electrode for a fluorescent light is coupled between the first contact receptacle and the second contact receptacle enabling the lamp to indicate an operational electrode has been detected.

Figure 1:
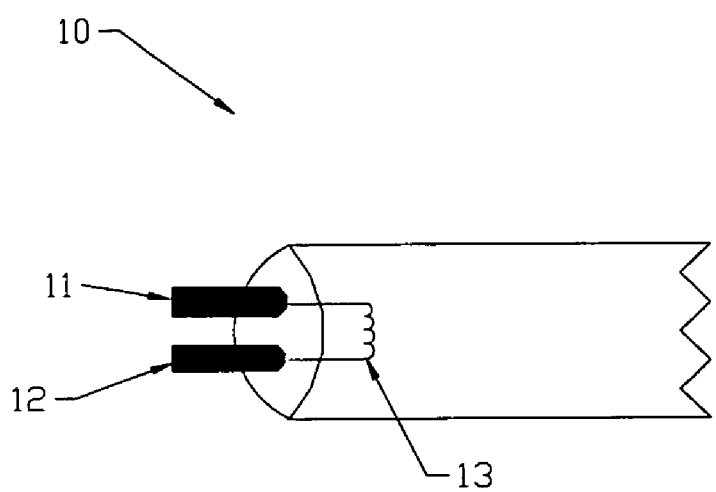
FIG. 1 illustrates a cross-sectional view of a conventional fluorescent light bulb according to one embodiment of the invention.

FIG. 1 illustrates a cross-sectional view of a conventional fluorescent light bulb according to one embodiment of the invention. Fluorescent bulb 10 is a conventional fluorescent light bulb having an electrode 13 coupled between a first conductor 11 and second conductor 12. As described above, an alternating current (AC) power source is typically connected to first conductor 11 and second conductor 12 to activate electrode 13 and illuminate fluorescent bulb 10.

Figure 2:
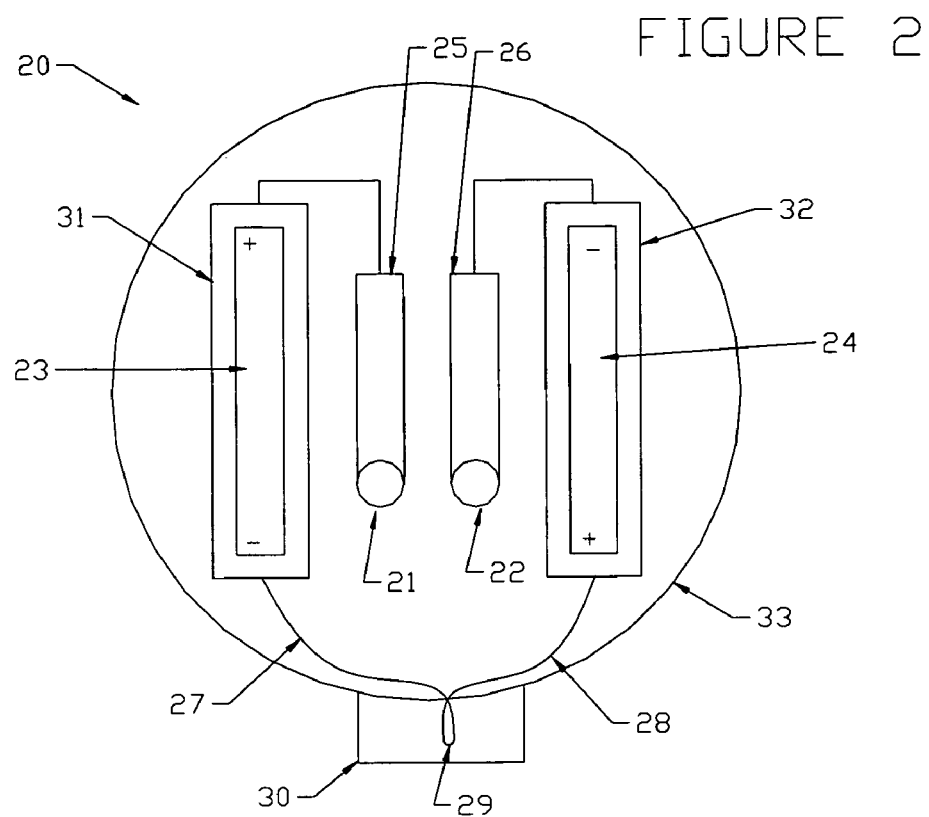
FIG. 2 illustrates a top perspective view of a fluorescent light bulb test apparatus according to one embodiment of the invention.

FIG. 2 illustrates a top perspective view of a fluorescent light bulb test apparatus according to one embodiment of the invention. Fluorescent light bulb test apparatus, or bulb tester 20, is used to test fluorescent bulbs such as fluorescent bulb 10 illustrated in FIG. 1 and the like. Bulb tester 20 includes a first contact receptacle 21 and second contact receptacle 22 for coupling first conductor 11 and second conductor 12 for a testing fluorescent bulb. In one embodiment, first contact receptacle 21 and second contact receptacle 22 are approximately one-eight of an inch in diameter and spaced to allow insertion of first and second conductors 11 and 12. First and second contact receptacles 21 and 22 may be centered to housing 33 although in other embodiments first and second contact receptacles 21 and 22 may be offset along housing 33.

First battery 23 is positioned within first battery holder 31 and second battery 24 is positioned within second battery holder 32. First and second battery holders 31 and 32 are sized depending on the type of bulb to be tested and may include a battery size such as a AA, AAA, AAAA, etc. First battery holder 31 is electrically connected between first contact receptacle 21 and lamp 29 via first lamp conductor 27. Additionally, second battery holder 32 is electrically connected between second contact receptacle 22 and lamp 29 via second lamp conductor 28. Lamp 29 is a low-voltage direct current lamp sized to illuminate if a satisfactory amount of current flow through is produced through electrode 13 when being tested.

Lamp 29 is housed within lamp housing 30 extending away from a sidewall of housing 33 and includes a transparent or semi-transparent plastic material that may be colored (i.e. green, red, orange, yellow, etc.) to provide a visual indication when lamp 29 is illuminated. For example, lamp hosing 30 may include a green tinted plastic material to indicate an operational status of a fluorescent lamp. Lamp housing 30 further includes a lamp socket (not expressly shown) and allows for easy removal and replacement of defective lamps through providing a grooved or screw on/off access and the like.

During use, bulb tester 20 may be placed over contacts or conductors of a fluorescent light bulb to test an operating condition of fluorescent light bulb. For example, fluorescent bulb 10 illustrated in FIG. 1 may be tested by aligning first conductor 11 within first contact receptacle 21 and second conductor 12 within second contact receptacle 22. If a valid or conductive circuit is encountered, current from first battery 23 and second battery 24 is provided in a sufficient amount to illuminate lamp 29 indicating that the electrical integrity of fluorescent light bulb is good or valid. If however, a portion of fluorescent bulb 10 is faulty, current will not flow through electrode 13 to illuminate lamp 29 indicating that a faulty fluorescent lamp has been detected. Various types of fluorescent bulbs may be tested using bulb tester 20 and various configurations may be provided depending on the type of bulb being tested. For example, if a fluorescent bulb includes two electrodes, such as an elongated fluorescent tube, a user would test each end of the fluorescent bulb to verify the bulb being operational. Additionally, bulb tester 20 may be configured to accommodate various other styles of fluorescent light bulbs having various end types as bulb tester 20 illustrates one configuration for testing one type of fluorescent light bulb.

Figure 3:
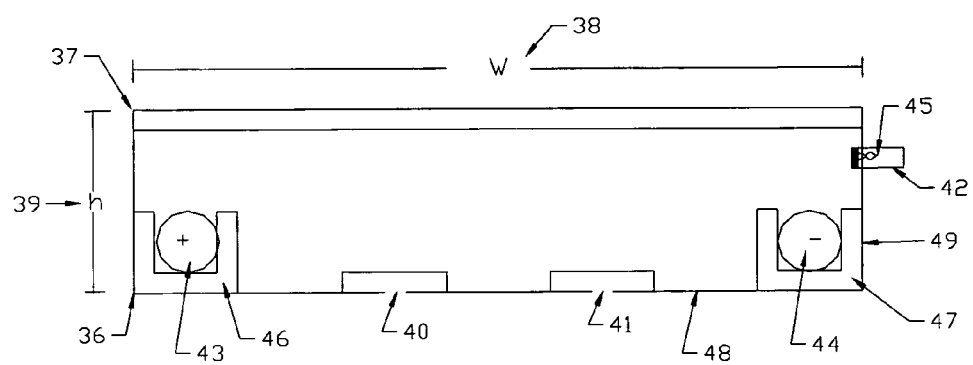
FIG. 3 illustrates a side perspective view of a fluorescent light bulb test apparatus according to one embodiment of the invention.

FIG. 3 illustrates a side perspective view of a fluorescent light bulb test apparatus according to one embodiment of the invention. Fluorescent light bulb test apparatus, or bulb tester 35, includes a housing 36 for housing components for testing a fluorescent light bulb such as fluorescent bulb 10 illustrated in FIG. 1. Housing 36 may be made of a plastic material having high visibility markings or colors (e.g. reflective materials, yellow shading, light green shading, etc.) to allow for efficient visual identification of bulb tester 35 when stored within a tool shed, tool box, etc. Housing 36 may further be configured to reduce exposure to elements such as moisture, dust, dirt, liquids, etc. through providing waterproofing or seals as needed.

Housing 36 further includes an access panel 37 operable to expose components housed within housing 36. For example, access panel 37 may be coupled to housing 36 through use of one or more screw(s) having screw receptacle(s) or threaded channel(s) (not expressly shown) to allow for removal and replacement of access panel 37. In another embodiment, access panel 37 may include threading along the circumference or outer perimeter of access panel 37 and housing 36 and sized to fit threading provided along the outer perimeter of housing 36 (not expressly shown). In this manner, access panel 37 may be coupled and uncoupled to housing 36 through use of an unscrewing and screwing motion similar to the lid of a conventional jar or screw top-like container.

Bulb tester 35 further includes a width 38 of approximately two inches and a height 39 of approximately one half inch and may be shaped cylindrically although other shapes may also be considered. Housing 36 includes a base 48 having a first battery holder 46 and first battery 43 housed within an interior of housing 36. Base 48 further includes a second battery holder 47 and second battery 44 to housing 36. In one embodiment first batter holder 46 and second battery holder 47 may be formed from a plastic material as a part of housing 36. First battery holder 46 is electrically connected to first contact receptacle 40 and lamp housing 42 operable to house lamp 45. Additionally, second battery holder 47 is electrically connected to second contact receptacle 41 and lamp housing 42 operable to house lamp 45 and provide power to lamp 45. Lamp housing 45 is coupled to sidewall 49 of housing 36 and extends away from sidewall 49 allowing for increased visibility of lamp 45 when illuminated.

First contact receptacle 40 and second contact receptacle 41 are formed as apertures that are approximately one eighth of an inch in diameter and extend through base 48. Each contact may be formed from a conductive material such as brass or any other type of conductive materials operable to efficiently conduct electricity and shaped to allow for a tension or compressed fitting of conductors of a fluorescent bulb when inserted into each receptacle.

In one embodiment, first battery holder 46 and second battery holder 47 are sized to house a specific type of battery and provide electrical connections to lamp 45 and first contact receptacle 40 and second contact receptacle 41. Each battery holder may include one or more spring loaded contacts or tension contacts (not expressly shown) for securely coupling each battery.

During use, electrodes for a fluorescent light bulb are aligned with first contact receptacle 40 and second contact receptacle 41 making electrical contact. If a valid electrode for the fluorescent light bulb is encountered, electrical current is coupled via electrical interconnects (not expressly shown) to light lamp 45 from first battery 43 and second battery 44 and sufficient to illuminate lamp 45 to indicate a valid or functional light bulb has been tested.

Figure 4:
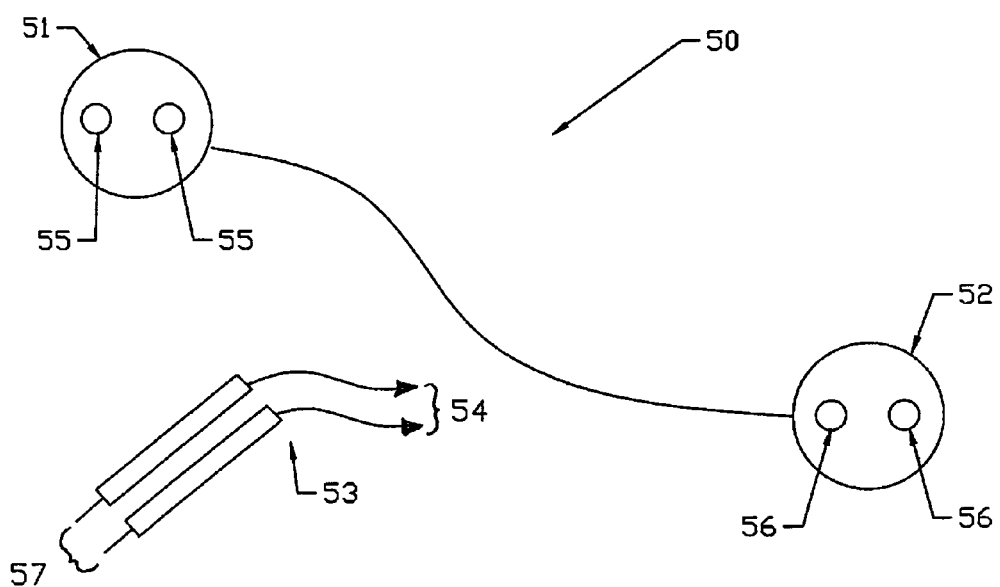
FIG. 4 illustrates a fluorescent light bulb test system according to one embodiment of the invention.

FIG. 4 illustrates a fluorescent light bulb test system according to one embodiment of the invention. Fluorescent light bulb test system, or bulb test system 50, includes a first bulb tester 51 and second bulb tester 52 for testing each end of a fluorescent tube (not expressly shown). In one embodiment, first bulb tester 51 and second bulb tester 52 are connected via a coupling material such as an elastic material, cord material, etc. although an electrically connection may be considered. First bulb tester 51 and second bulb tester 52 are spaced to allow for connecting each end of a fluorescent light tube. Bulb test system 50 further includes test leads 53 including test lead contacts 54 sized to fit within contact receptacles 55 of either first bulb tester 51 or contact receptacles 56 of second bulb tester 52. Test leads 53 may also be used with a single bulb tester such as bulb tester 20 illustrated in FIG. 2 or bulb tester 35 illustrated in FIG. 3. Test leads 53 also include test lead probes 56 that may be used to electrically connect a bulb tester to contacts of a fluorescent bulb and may include various end types (i.e. clips, probe tips, probe hooks, etc.) as needed. As such, test leads 53 may be used to connect each contact of a fluorescent bulb to either first bulb tester 51 or second bulb tester 52 allowing for testing of a fluorescent bulb.

During use, bulb test system 50 may be used to test simultaneously test each end of a fluorescent light tube to determine the functionality of the fluorescent light tube. First bulb tester 51 and second bulb tester 52 may be placed on each end of a fluorescent light tube. If a functioning electrode associated with each end of the light tube is encountered, each lamp for first bulb tester 51 and second bulb tester 52 illuminates to indicate a fluorescent light tube is functioning properly. If either or both bulb testers 51 and/or 52 do not illuminate, a faulty fluorescent light tube has been encountered and should not be used.

Note that although an embodiment of the invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the invention is not intended to be limited to the specific form set forth herein, but on the contrary, it is intended to cover such alternatives, modifications, and equivalents, as can be reasonably included within the spirit and scope of the invention.

What is claimed is:

1. An apparatus for testing a fluorescent light bulb comprising:
    a circular housing including a pair of contact receptacles operable to receive two conductive elements of a fluorescent light bulb;
    a lamp housing extending from a portion of an outside surface of the circular housing, the lamp housing operable to connect a low-voltage lamp;
    a power source electrically coupled between the contact receptacles and the low-voltage lamp, the power source operable to light the low-voltage lamp when a electrode of the fluorescent light bulb is electrically coupled between the contact receptacles;
    a first battery holder electrically coupled between the lamp housing and one of the contact receptacles, the first battery holder sized to secure a replaceable battery; and
    a second battery holder electrically coupled between the lamp housing and a second contact receptacle, the second battery holder sized to secure a replaceable battery.

2. The apparatus as recited in claim 1 wherein the housing includes an access panel coupled to a top portion of the housing and moveable to provide access to an interior portion of the housing.

3. The apparatus as recited in claim 1 wherein the housing includes a high-visibility material to promote enhanced visual identification.

4. The apparatus as recited in claim 1
    wherein the lamp housing is electrically coupled between the first battery holder and second battery holder; and further comprising:
    a first contact receptacle of the contact pair electrically coupled to the first battery holder and a second contact receptacle of the contact pair electrically coupled to the second battery holder.

5. The apparatus as recited in claim 1 wherein the pair of contact receptacles substantially centered along the bottom surface of the housing.

6. The apparatus of claim 1 further comprising conductor means for electrically connecting a first battery between a first contact receptacle and the lamp housing.

7. The apparatus as recited in claim 1 wherein the housing comprises a plastic material.

8. The apparatus as recited in claim 1 further comprising test leads operable to be coupled to the contact receptacles.

9. An apparatus for testing fluorescent light bulbs comprising:
    a housing including a base and a side
    wherein the first and second receptacles are approximately one eight (⅛) of an inch in diameter and spaced between one half (½) inch and one (1) inch;
    a access panel coupled to a top portion of the housing to provide access to an interior of the housing;
    wherein the interior includes a portion of the base comprising:
        a first battery holder coupled to the base and operable to hold a AAA direct current battery;
        a second battery holder coupled to the base and operable to hold a AAA direct current battery;
        a first contact receptacle coupled to the first battery holder using a brass interconnect;
        a second contact receptacle coupled to the second battery holder using a brass interconnect;
    wherein the sidewall includes a lamp housing extending through the side wall from the interior of the housing to an exterior of the housing, the lamp housing operable to house a low-voltage lamp;
    a first conductor directly connected between a first lamp conductor and the first battery holder; and
    a second conductor directly connected between a second lamp conductor and the second battery holder.

10. The apparatus as recited in claim 9 wherein the base includes a molded plastic material formed to provide the first battery holder and the second battery holder.

11. The apparatus as recited in claim 9 wherein the housing includes a high visibility plastic material.

12. The apparatus as recited in claim 9 further comprising a second housing coupled to the first housing at a distance from to the first housing, the second housing including electrical components operable to simultaneously test a second electrode of the fluorescent bulb.

13. The apparatus of claim 9 further comprising a test system including at least two test leads removeably coupleable to the first and second contact receptacles, the test leads operable to connect to a contact of the fluorescent bulb.

14. The apparatus of claim 9 wherein the lamp housing includes a semitransparent plastic material extending away from the sidewall of the housing.

15. A fluorescent light bulb test apparatus comprising:
    a circular housing including a base and a side wall;
    an access panel removeably coupled to an upper portion of the housing;
    a first and second battery holder formed as a part of the base and operable to hold a first and second battery and wherein said battery holder sized to fit a AAA direct current battery;
    a first and second electrical contact receptacle coupled to base and substantially centered along the base, the first electrical contact receptacle electrically coupled to the first battery holder and the second electrical contact receptacle electrically coupled to the second battery holder;
    a lamp housing coupled to an interior of the circular housing and along the side wall of the circular housing and electrically coupled to the first and second battery holders; and
    wherein the housing includes:
        a width between two (2) inches and three (3) inches; and
        a height one half (½) inch and one (1) inch.

16. The apparatus of claim 15 further comprising the first and second electrical contact receptacles including a diameter of one eighth (⅛) of an inch and spaced at a distance for testing an electrode of an fluorescent light tube.

* * * * *